United States Patent [19]

Nakabayashi et al.

[11] Patent Number: 4,975,873
[45] Date of Patent: Dec. 4, 1990

[54] CONTENT ADDRESSABLE MEMORY WITH FLAG STORAGE TO INDICATE MEMORY STATE

[75] Inventors: Takeo Nakabayashi; Harufusa Kondou, both of Hyogo, Japan

[73] Assignee: Mitsubishi Denki Kabushiki Kaisha, Tokyo, Japan

[21] Appl. No.: 283,293

[22] Filed: Dec. 12, 1988

[30] Foreign Application Priority Data

Mar. 1, 1988 [JP] Japan ................................. 63-49092

[51] Int. Cl.$^5$ ............................................. G11C 15/00
[52] U.S. Cl. ................................... 365/49; 365/189.01; 364/200; 364/900
[58] Field of Search ............... 365/49, 189.01, 189.07; 364/200 MS File, 900 MS File

[56] References Cited

U.S. PATENT DOCUMENTS 4,670,858  6/1987  Almy .................................... 365/49
4,888,731 12/1989  Chuang et al. ........................ 365/49

FOREIGN PATENT DOCUMENTS 1118906 12/1978  Canada .
2853926  6/1979  Fed. Rep. of Germany .
57-74889  5/1982  Japan .
74889  5/1982  Japan .

OTHER PUBLICATIONS

T. Ogura et al., "A 4 kb Associative Memory LSI", 55083-78, pp. 45-52.
C. V. Ramamoorthy et al., "A Design of a Fast Cellular Associateive Memory for Ordered Retrieval", pp. 800-815, IEEE Trans. on Computers, vol. C-27, No. 9, Sep. 1978, pp. 800-815.
Hiroshi Kadota et al., "An 8-Kbit Content-Addressable and Reentrant Memory", IEEE Journal of Solid State Circuits, Oct. 1985, vol. SC-20, No. 5, pp. 951-956.
J. Of Institute of Electronics: "4 Kb Associative Memory LSI", by Takeshi Ogura et al., Dec. 1983, pp. 45-52.
IEEE Transactions on Computers: "A Design of a Fast Cellular Associative Memory of Ordered Retrieval", by C. V. Ramamoorthy et al., vol. C-27, No. 9, 9/78, pp. 800-815.
IEEE J. of Sol.-St. Circuits: "An 8-kbit Content-Addressable and Reentrant Memory", by H. kadota et al., vol. SC-20, No. 5, Oct. 1985, pp. 951-956.

*Primary Examiner*—Glenn Gossage
*Attorney, Agent, or Firm*—Lowe, Price, Leblanc, Becker & Shur

[57] ABSTRACT

A content addressable memory device capable of correct retrieval operation comprises a flag bit column (12) provided in a memory cell array. The flag bit column (12) stores a flag signal indicating whether a word is in a data written state or an empty state for each word in a data array (2). In the retrieval operation, the data written in the data array (2) and a flag bit column (12) are simultaneously retrieved, providing a correct retrieval result. In addition, since the flag bit column (12) is provided in the memory cell array, it can be controlled in a manner similar to controlling the data array (2).

10 Claims, 13 Drawing Sheets

DATA READING

1

CONTENT ADDRESSABLE MEMORY WITH FLAG STORAGE TO INDICATE MEMORY STATE

BACKGROUND OF THE INVENTION

1. Field of the Invention

The present invention relates generally to a content addressable memory and, more specifically, it relates to a content addressable memory in which the retrieval operation can be more correctly carried out.

2. Description of the Prior Art

As is generally known, the content addressable memory device (hereinafter abbreviated as CAM) is a memory device which is also called an associative memory. Data is retrieved from a CAM using a part of the data content to find a position in which the content is stored, and designating part of the content to take out the remaining content.

More specifically, the CAM compares the data stored in each memory cell of the CAM with the retrieval data used for the retrieval and when they coincide with each other, it outputs required information from that address where the coincidence occurs.

Usually, data is written by external normal writing operation in the memory cell array of the CAM. In some cases, however, some data stored in the memory cell array of the CAM cannot be known externally. The existence of such unknown data is not desirable. Namely, when the retrieval data is applied to the memory cell array, the stored data may possibly coincide with the retrieval data. In that case, correct retrieval information cannot be obtained.

Even if all memory cells in the array of the CAM are reset by a signal "0" in order to solve the problem, when the retrieval data having all signals being "0" is applied to the memory cell array, these data coincide with each other, causing incorrect result of retrieval.

As described above, a conventional CAM has a disadvantage that the result of the retrieval is not always correct. In addition, complicated control of the CAM is required in order to avoid the above mentioned disadvantage.

Prior Arts of particular interest to solve these problems will be briefly described in the following.

Figure 1:
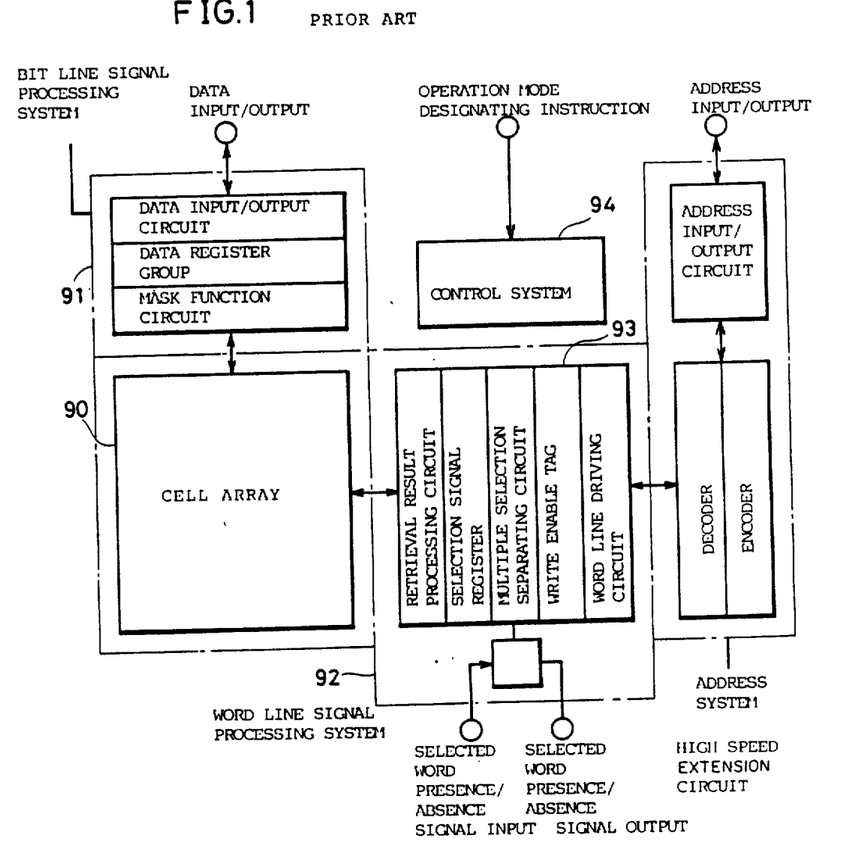
FIG. 1 is a block diagram showing a conventional associative memory LSI.

FIG. 1 is a block diagram showing an associative memory LSI disclosed in the Journal of Institute of Electronics and Communication Engineers of Japan by Takeshi (semiconductor transistor) on Dec. 1, 1983, pp. 45-52 by Takeski Ogura et al.

Referring to FIG. 1, the associative memory comprises a cell array 90, a bit line signal processing system 91 connected to the cell array 90 and a word line signal processing system 92 connected to the cell array 90. The word line signal processing system 92 comprises a write enable tag 93 for indicating whether the data of the word is necessary or not for each of the words in the cell array 90. By retrieving the write enable tag 93, a word which can be written (i.e. there is no need of holding the data) can be found from the cell array 90. Therefore, when new data should be written, the word to be written can be easily found without designation or administration of the address of the cell array by the CPU. Namely, in this operation, the address need not be controlled from outside of the associative memory.

The disclosed prior art associative memory simplifies the control in the writing operation, but does not solve the above described problems in the retrieval operation. Although the write enable tag 93 is not described in detail, it seems to be a collection of registers provided separately from the cell array 90, and a control circuit for controlling the write enable tag may be separately required.

Japanese Patent Laying-Open Gazette No. 57-74889 discloses a content similar to the prior art of FIG. 1.

An example of the prior art of particular interest is also disclosed in "Design of a Fast Cellular Associative Memory for Ordered Retrieval" by C. V. RAMAMOORTHY et al. published in September 1978 (IEEE TRANSACTIONS ON COMPUTERS, VOL. C-27, No. 9, pp. 800-815). This article also shows a flag register for each word provided separately from the memory cell array. As described above, when a register is employed as an element constituting the flag, a separate control circuit must be provided for controlling the same.

Another example of the prior art of particular interest is disclosed in "An 8-K bit Content-Addressable and Reentrant Memory" by HIROSHI KADOTA et al. published in October 1985 (IEEE JOURNAL OF SOLID-STATE CIRCUITS, VOL. SC-20, No. 5, pp. 951-956). In this article, the memory region of the memory cell array is divided into an occupied region in which data are written and a non-occupied region in which no data is written. A method for effectively administering the memory region of the CAM by controlling the writing operation into the occupied and non-occupied regions is disclosed.

SUMMARY OF THE INVENTION

One object of the present invention is to carry out a retrieval operation correctly in a content addressable memory (hereinafter simply referred to as CAM) device.

Another object of the present invention is to carry out a retrieval operation correctly in a CAM device utilizing a flag signal indicating whether each word is in a data written state or in an empty state.

A further object of the present invention is to carry out a retrieval operation correctly in a CAM device by storing a flag signal indicating the word data written state or the empty state in a CAM cell array.

A still further object of the present invention is to carry out a retrieval operation correctly in a CAM device without providing additional complicated control circuit means.

Briefly stated, the present invention comprises: a predetermined column in a CAM cell array forming a flag storing circuit; a first input/output control circuit inputting and outputting data to the CAM cell array; a second input/output control circuit inputting a signal indicating whether each word in the CAM cell array is in a data written state or an empty state to the flag storing circuit; a reset circuit for writing the flag signal indicating the empty state for all words of the flag storing circuit; an empty word retrieving circuit for detecting an empty word by making a retrieval in the flag storing circuit by the flag signals from the second input/output control circuit; a data writing circuit for writing in the empty word of the CAM cell array the data from the first input/output control circuit and for simultaneously writing in the corresponding portion of the flag storing circuit the flag signal indicating the data written state; and specified word retrieving circuit for detecting a specified word by making a retrieval in the CAM cell array with the retrieval data from the first input/output control circuit and simultaneously making retrieval in the flag storing circuit with the flag signal from the second input/output control circuit.

In a reset operation, the flag signal indicating the empty state from the second input/output control circuit is written for all the words in the flag storing circuit by the reset circuit. In the writing operation, the empty word retrieving circuit detects the empty word. The data writing circuit writes the data from the first input/output control circuit in the empty word in the CAM cell array and simultaneously writes the flag signal indicating the data written state in the corresponding portion of the flag storing circuit. In the retrieval operation, the specified word retrieving circuit makes a retrieval in the CAM cell array with the data from the first input/output control circuit and simultaneously makes a retrieval in the flag storing circuit with the flag signal from the second input/output control circuit. Therefore, a specified word can be correctly detected from words with a flag signal indicating the data written state stored in the flag storing circuit. In addition, since the first and second input/output control circuits are provided for accessing the CAM cell array, there is no need to provide additional complicated circuits as the second input/output control circuit.

In another aspect, the present invention is a method for operating a CAM device comprising a predetermined column provided in a CAM cell array forming a flag storing circuit, a first input/output control circuit inputting and outputting data to the CAM cell array, and a second input/output control circuit inputting a signal indicating whether each word in the CAM cell array is in a data written state or in an empty state to the flag storing circuit, comprising the steps of: writing a flag signal indicating an empty state for all the words in the flag storing circuit for resetting; detecting the empty word by making a retrieval in the flag storing circuit with the flag signal from the second input/output control circuit; writing in the empty word in the CAM cell array the data from the first input/output control circuit and simultaneously writing in the corresponding portion in the flag storing circuit the flag signal indicating the data written state; and detecting a specified word by making a retrieval in the CAM cell array with the retrieval data from the first input/output control circuit and simultaneously making a retrieval in the flag storing circuit with the flag signal from the second input/output control circuit.

According to this method, a specified word can be correctly detected in the retrieval operation as described above. In addition, there is no need to provide an additional complicated circuit as the second input/output control circuit.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
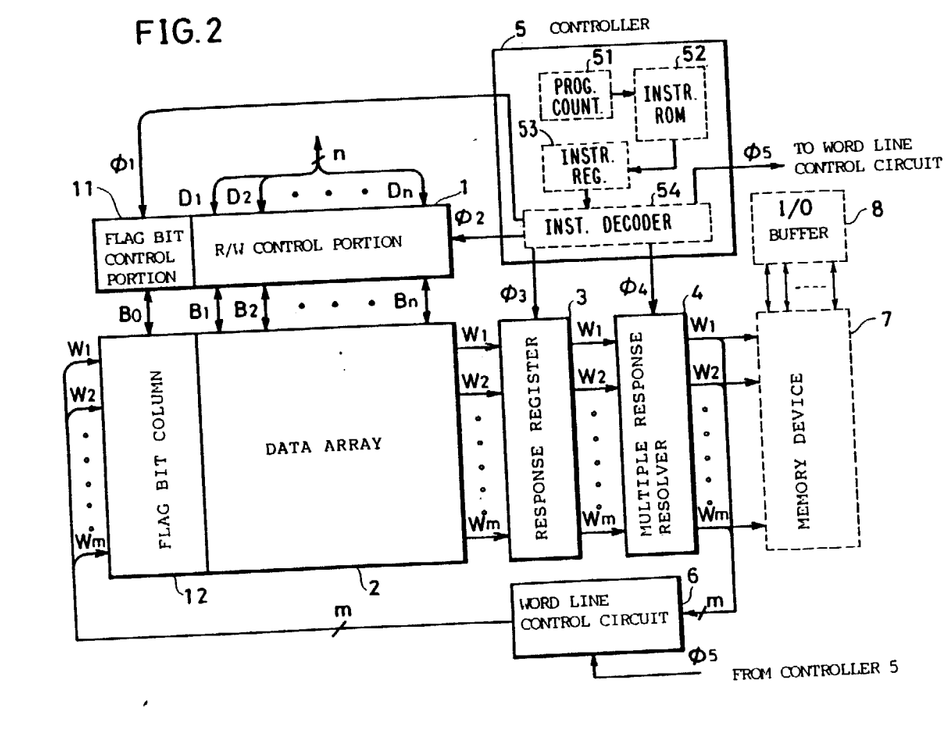
FIG. 2 is a block diagram showing a content addressable memory in accordance with one embodiment of the present invention.

FIG. 2 is a block diagram showing one embodiment of a content addressable memory device (hereinafter abbreviated as CAM) in accordance with the present invention.

Referring to FIG. 2, the CAM comprises a data array 2 in which the reading and writing of data is carried out; a read/write control portion 1 for inputting/outputting data and the retrieval data with the timing controlled to and from the data array 2 through data bit lines B1 to Bn; a flag bit column 12 for storing a flag signal indicating the state of writing of each word; and a flag bit control portion 11 coupled to the read/write control portion 1 for inputting/outputting a flag signal with the timing controlled to the flag bit column 12 through a flag bit line B0. The data array 2 and the flag bit column 12 are provided in a memory cell array of the CAM.

The CAM further comprises a response register 3 which receives the retrieval signals outputted from the flag bit 12 and from the data array 2 for carrying out the retrieval and temporrily stores the result; a multiple response resolver 4 which determines one out of a plurality of results obtained from the retrieval in accordance with a predetermined logic; a word line control circuit 6 for driving and controlling word lines W1 to Wn; and a controller 5 which outputs timing control signals $\phi_1$ to $\phi_5$.

The controller 5 comprises, for example, a host processor, which has a program counter 51, an instruction ROM 52, an instruction register 53 and an instruction decoder 54. The control signals $\phi_1$ to $\phi_5$ are outputted from the instruction decoder 54 based on the program stored in the instruction ROM 52.

In FIG. 2, the memory device 7 is connected through word lines W1 to Wn as shown by the dotted line, and the input/output of the data is carried out through an input/output buffer 8 for the word determined by the CAM.

The control signals $\phi_1$ to $\phi_5$ respectively comprise various control signals, which are generally denoted by the reference characters $\phi_1$ to $\phi_5$ in FIG. 1. The word lines W1 to Wn comprise, the respective word lines and signal lines incidental thereto, however, the signal lines are omitted in the figure. The details will be made clear in the detailed description of each block which will be given later with reference to FIGS. 4 to 7.

The general operation will be described in the following.

First, when a reset signal $\phi_5$ is applied to the word line control circuit 6 from the control circuit 5, all word lines W1 to Wn are selected. At this time, the flag bit control portion 11 applies binary data "0" (flag signal for resetting) onto the bit line B0 in response to the control signal $\phi_1$. The flag bit column 12 connected to the flag bit control portion 11 through the bit line B0 receives the data "0" to be reset with the data "0" written therein. Thus the resetting operation is completed. On this occasion, the data written in the data array 2 is unknown, but it has no influence in the succeeding operation as will be described later.

The data writing operation will be described in the following. Immediately after the completion of the resetting operation, all words are in the empty state (the required data are not written); however, in general, busy words (in which the necessary data are written) and empty words exist together when the CAM is employed. Therefore, in the reading operation, the detection of the empty word is carried out in the beginning.

The detection of the empty word is carried out with the data "0" being applied to the flag bit column 12 from the flag bit control portion 11 with the data array being masked. Consequently, the word holding the data "0" in the flag bit column 12, that is, the empty word is detected by the response register 3. In this case, a plurality of results of the retrieval exist in general, so that the multiple response resolver 4 selects one word therefrom.

The word line control circuit 6 selects the word line of the selected word. On this occasion, the read/write control portion 1 outputs the data to be written on the data bit lines B1 to Bn, while the flag bit control portion 1 outputs the data "1" (the data "1" is a flag signal indicating that the word has been written) onto the flag bit line B0. Consequently, the data is written in the data array 2, and, simultaneously, the data "1" is written in the flag bit column 12 for the above described selected word.

In the retrieval operation, first, the flag bit control portion 11 outputs the data "1" on the bit line B0 and, simultaneously, the read/write control portion 1 outputs the retrieval data on the bit lines B1 to Bn. Consequently, the retrieval operation is carried out simultaneously for the flag bit column 12 and for all bit lines B0 to Bn in the data array. Now, the retrieval for the flag bit column 12 is carried out by the data "1", so that the word holding the data "0", that is, the empty word in the flag bit column 12 is not retrieved even if a data which coincides with the retrieval data is stored in the data array 2.

Since a plurality of words are retrieved in general, the response register 3 temporarily holds the results of the retrieval and one result of the retrieval is determined by the multiple response resolver 4.

In the word invalidating operation, the word to be invalidated is retrieved at first. The retrieval operation is carried out in the similar manner as the above described retrieval operation. However, when all of the words retrieved should be invalidated, the above described operation of the multiple response resolver 4 is omitted. Thereafter, the data "0" is written in the flag bit column 12 of the word obtained by the retrieval operation.

FIGS. 3A to 3F are schematic diagrams showing the change of the contents in the flag bit column and the data array with the CAM shown in FIG. 2 applied thereto. The data array 2 is connected to ten data bit lines B1 to B10 (that is, n=10) and eight word lines W1 to W8 (that is, m=8) for the purpose of simplicity.

Figure 3A:
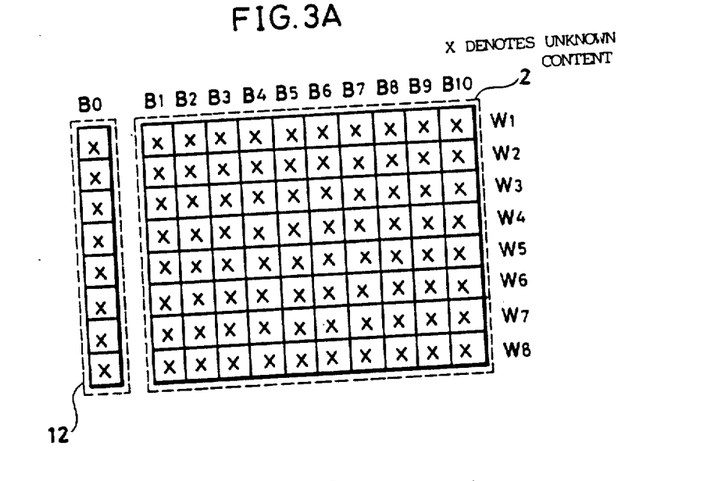
FIGS. 3A to 3F are schematic diagrams showing the change of the data written in the flag bit column and the data array for illustrating the operation of the memory of FIG. 1.

FIG. 3A shows the state of the flag bit column 12 and the data array 2 before the resetting. The reference character X shows that the stored content is unknown. Therefore, in FIG. 3A, all of the contents stored in the memory cells are unknown.

Figure 3B:
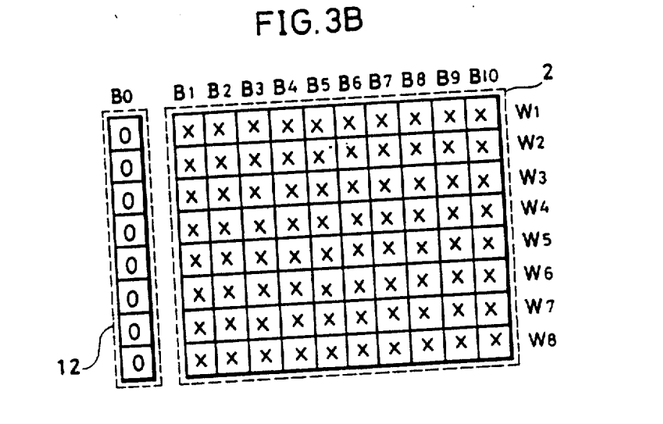

FIG. 3B shows the state after resetting. The flag bit column 12 is reset by the data "0". Meanwhile, the contents in the data array 2 remain unknown.

If the retrieval of empty words for writing the retrieval data is carried out at this time, all words response coincidentally, since the retrieval of the empty word is carried out by retrieving the flag bit line B0 with the data "0".

Figure 3C:
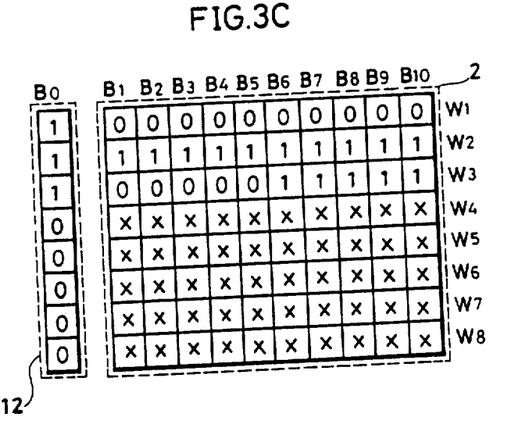

FIG. 3C shows the state in which the data "0000000000", the data "1111111111", the data "0000011111" are written respectively in the first, second and third words of the data array 2. Simultaneously with the writing of the retrieval data for each word, "1" is written in the corresponding word in the flag bit column 12.

Figure 3D:
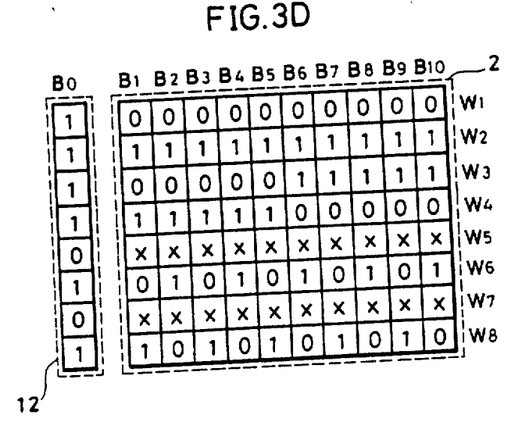

FIG. 3D shows the state in which data are written in the first, second, third, fourth, sixth and eighth words, respectively. In this state, if further retrieval data should be written, the flag bit column 12 is retrieved with the data "0" at first. Therefore, the fifth and the seventh words are detected as the empty words.

Figure 3E:
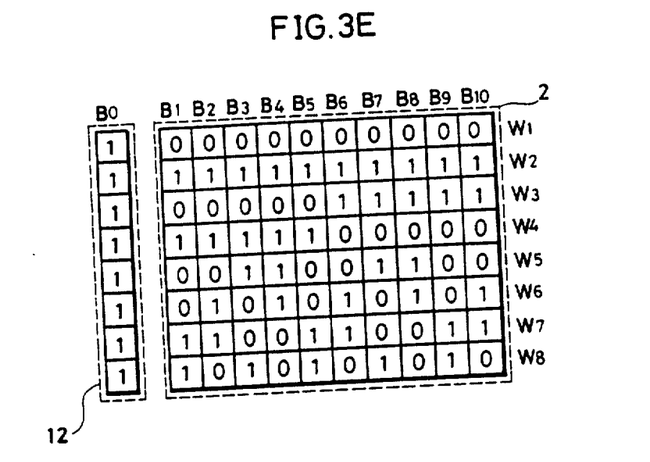

FIG. 3E shows the state in which the retrieval data are written in all words. When the retrieval of data is carried out, the data "1" is applied to the flag bit line B0 and the retrieval data are applied to the data bit lines B1 to B10, respectively. When the retrieval data is "1111100000", for example, the data coincides in the fourth word. Therefore, that word is the result of the retrieval.

Figure 3F:
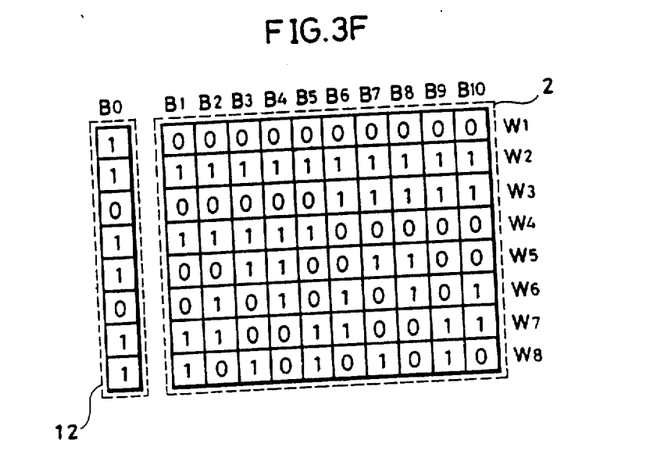

FIG. 3F shows that the third and sixth words are in the empty state. In order to make the third and sixth words empty, the word invalidating operation is carried out. In FIG. 3F, the value of the flag bit column 12 for the third and the sixth words is "0", so that the words do not respond coincidentally in the data retrieval. Since the third and sixth words are detected as the empty words, new retrieval data can be written in these words.

Although the retrieval operation is carried out for all bits (10 bits) of each word in the data array 2 in the foregoing, the retrieval operation can be carried out with a portion being masked. For example, in FIG. 3E, if the retrieval data such as "MMMMM00000" is applied (M shows that the bit is masked), the retrieval data coincides in the first and fourth words.

Although the value "0" of the flag bit column 12 denotes the empty word and the value "1" denotes the busy word in the foregoing, the same effect can be obtained when the value is reversed.

Figure 4:
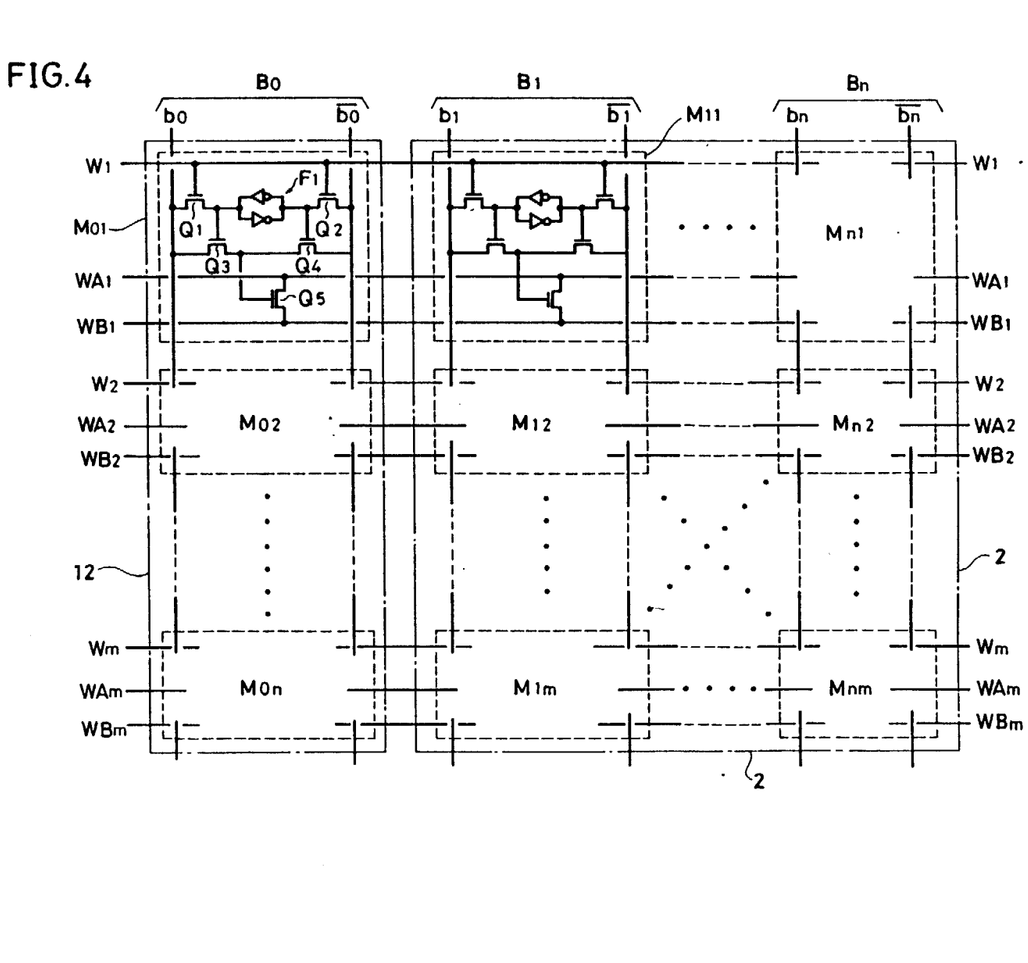
FIG. 4 is a schematic diagram showing one example of the flag bit column and the data array employed in one embodiment of the present invention.

FIG. 4 is a schematic diagram showing one example of the flag bit column and the data array employed in the present invention.

Referring to FIG. 4, the flag bit column 12 comprises memory cells $M_{01}$ to $M_{0m}$ respectively connected to flag bit lines b0 and $\overline{b0}$ and to word lines W1 to Wn. The data array 2 comprises memory cells $M_{11}$ to $M_{nm}$ respectively connected to data bit lines b1 and $\overline{b1}$ to bn and $\overline{bn}$ and to the word lines W1 to Wn. In the example of FIG. 4, the memory cells included in the flag bit column 12 and in the data array 2 have the same circuit structure.

For example, the memory cell $M_{01}$ comprises a series connection of an N channel MOS transistor Q1, a flip flop F1 constituted by two inverters and an N channel MOS transistor Q2 connected between the bit line b0 and $\overline{b0}$; a series connection of N channel MOS transistors $\overline{Q3}$ and Q4; and an N channel MOS transistor Q5 connected between a retrieval output line WA1 and a common line WB1.

The gates of the transistors Q1 and Q2 are connected to the word line W1. The gate of the transistor Q3 is connected to a node between the transistor Q1 and the flip flop F1. The gate of the transistor Q4 is connected to a node between the flip flop F1 and the transistor Q2. The gate of the transistor Q5 is connected to a node between the transistors Q3 and Q4.

Other memory cells are also connected to the corresponding bit lines, word lines, retrieval output lines and common lines in the similar manner as the memory cell $M_{01}$.

The writing operation and the retrieval operation for the memory cell will be described in the following, taking the memory cell $M_{01}$ as an example.

In the writing operation, the word line W1, for example, is brought to a high level and, simultaneously, the bit line b0 is brought to a low level, for example, and the bit line $\overline{b0}$ is brought to a high level. Consequently, the flip flop F1 holds the data supplied from the bit line.

In the retrieval operation, all word lines are brought to low level. Now, if the data which is the same as the written data is applied to the bit line, that is, the bit line b0 is brought to a low level and the bit line $\overline{b0}$ is brought to a high level, that transistor Q5 turns on. Meanwhile, if data opposed to the written data is applied, namely, the bit line $\overline{b0}$ is brought to the high level and the bit line b0 is brought to the low level, the transistor Q5 turns off. Therefore, by detecting the continuity between the retrieval output line WA1 and the common line WB1, whether the written data and the data applied for retrieval coincides or not can be detected.

Figure 5:
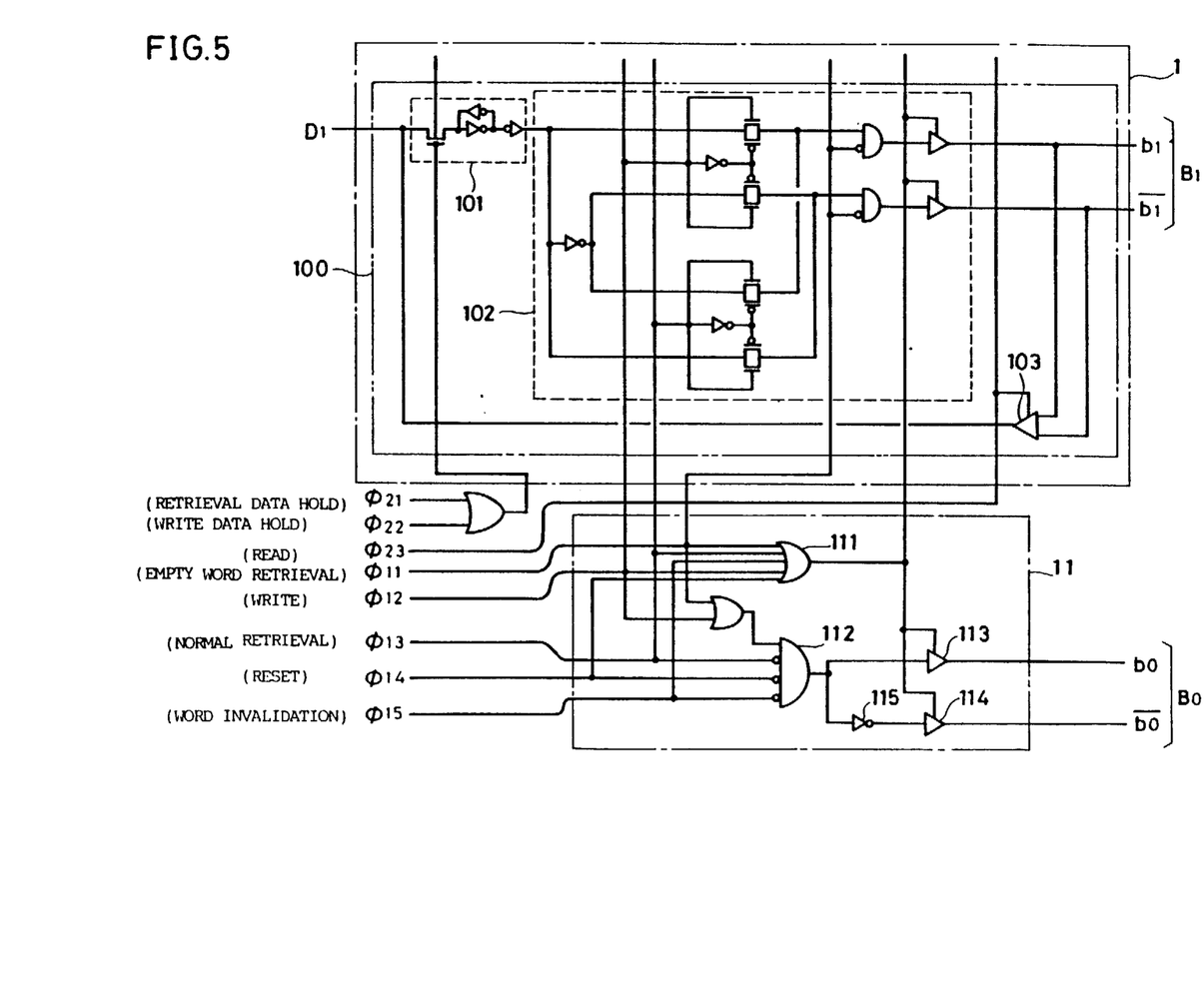
FIG. 5 is a schematic diagram showing one example of a flag bit control portion and a reading/writing control portion employed in one embodiment of the present invention.

FIG. 5 is a schematic diagram showing one example of the flag bit control portion and the read/write control portion employed in the present invention. For the purpose of simplicity, only a portion of the read/write control portion 1 which is connected to the bit lines b1 and $\overline{b1}$ is illustrated.

Referring to FIG. 5, the flag bit control portion 11 comprises an OR gate 111 and an AND gate 112 to which the empty word retrieval signal $\phi_{11}$, a write signal $\phi_{12}$, a normal retrieval signal $\phi_{13}$, a reset signal $\phi_{14}$ and a word invalidation signal $\phi_{15}$ are applied, two tri-state buffers 113 and 114, and an inverter 115. The flag bit lines b0 and $\overline{b0}$ are connected to the outputs of the tri-state buffers 113 and 114, respectively.

The read/write control portion 1 comprises an input buffer portion 101 responsive to a retrieval data holding signal $\phi_{21}$ or to a write data holding signal $\phi_{22}$ for temporarily holding an externally applied data D1 (retrieval data or a write data), a signal outputting portion 102 which receives an output signal from the input buffer portion 101 for outputting a bit line signal in response to a signal from the flag bit control portion 11, and a tri-state buffer 103 which receives signals from the data bit lines b1 and $\overline{b1}$ for externally outputting the same.

Figure 6:
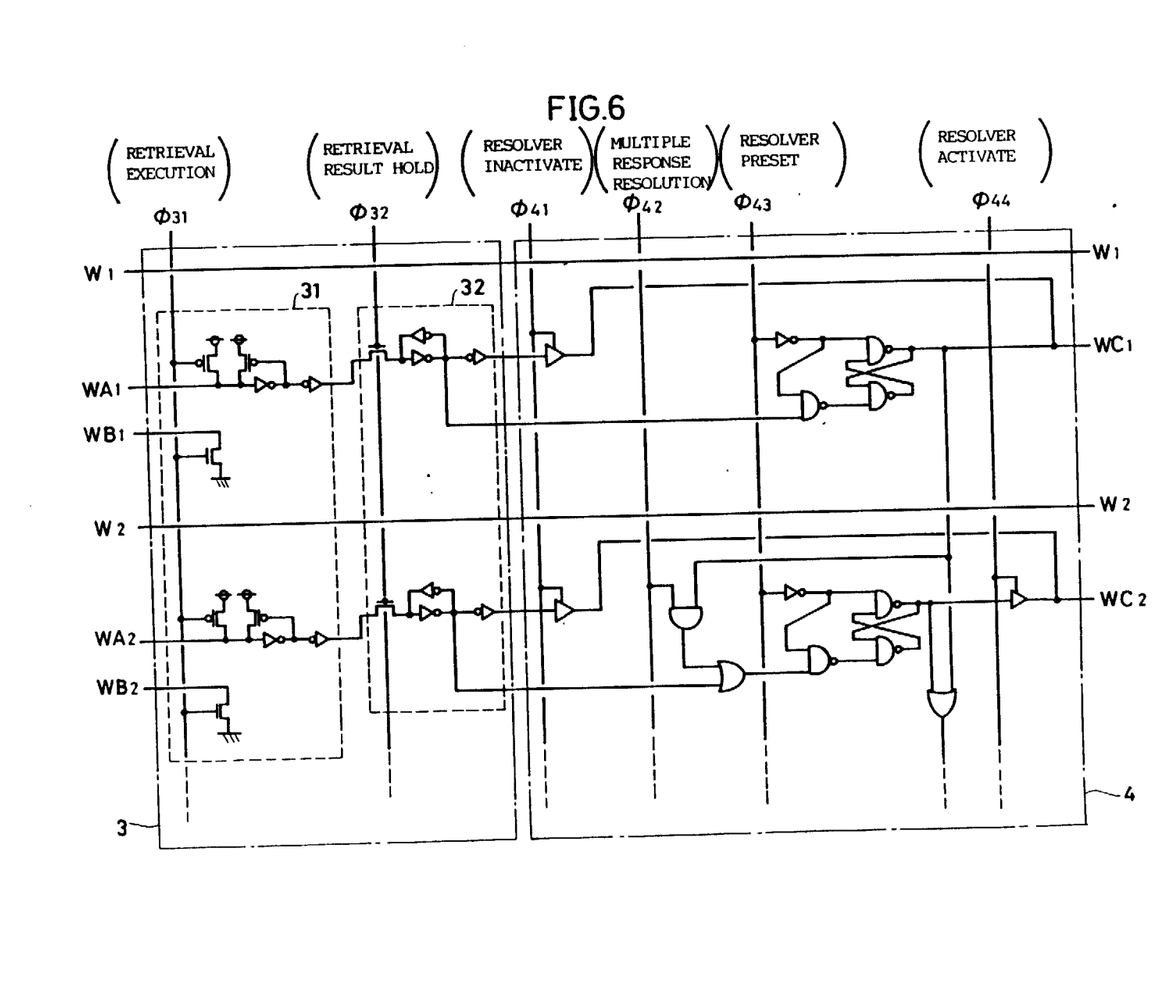
FIG. 6 is a schematic diagram showing one example of a response register and a multiple response resolver employed in one embodiment of the present invention.

FIG. 6 is a schematic diagram showing one example of a response register and a multiple response resolver employed in the present invention. For the purpose of simplicity, only the portions related to the word lines W1 and W2 are shown in the figure.

The response register 3 comprises a retrieval executing portion 31 responsive to a retrieval execution signal $\phi_{31}$ for executing the retrieval for the word, and a result holding portion 32 responsive to the retrieval result holding signal $\phi_{32}$ for holding the result of the retrieval.

The multiple response resolver 4 comprises a preset circuit responsive to a preset signal $\phi_{43}$ for presetting the resolver, and a resolving circuit responsive to a multiple response resolving signal $\phi_{42}$ for multiple response resolving the plurality of retrieval results. The retrieval result signal is outputted through the output signal lines WC1 and WC2. The signal $\phi_{41}$ is a resolver inactivating signal and the signal $\phi_{44}$ is a resolver activating signal, which are the inversion of each other.

Figure 7:
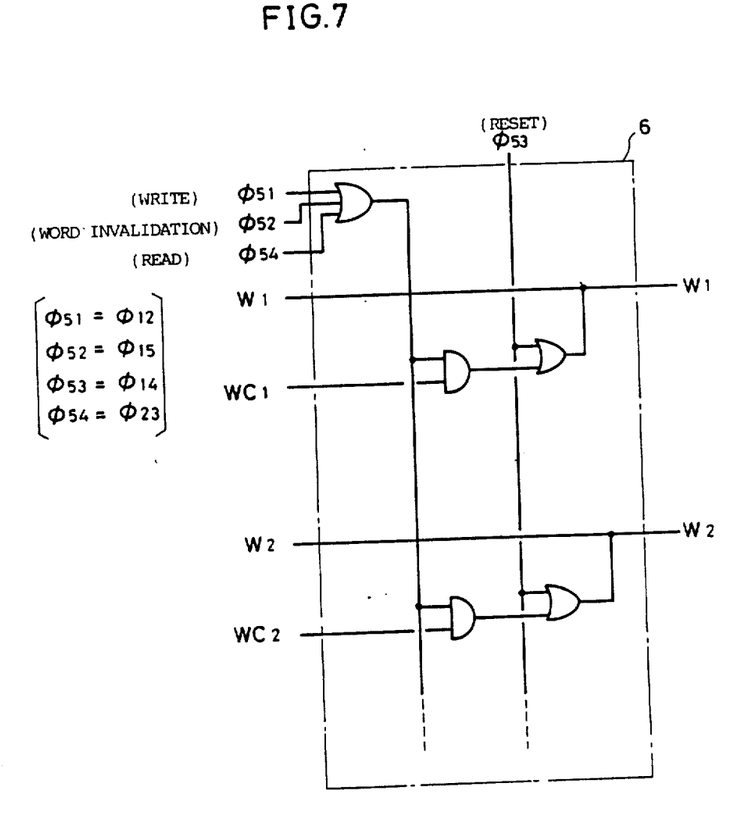
FIG. 7 is a schematic diagram showing one example of a word line control circuit employed in one embodiment of the present invention.

FIG. 7 is a schematic diagram showing one example of the word line control circuit employed in the present invention. In the figure, only the portions connected to the word lines W1 and W2 are shown for the purpose of simplicity.

Referring to FIG. 7, the word line control circuits 6 is connected to the word lines W1 and W2 and to the output signal lines WC1 and WC2 of the multiple response resolver 4. A write signal $\phi_{51}$ ($=\phi_{12}$), a word invalidating signal $\phi_{52}$ ($=\phi_{15}$), a reset signal $\phi_{53}$ ($=\phi_{14}$) and a read signal $\phi_{54}$ ($=\phi_{23}$) are applied to the word line control circuit 6.

The control for operating the CAM will be described in the following the reference to FIGS. 4 to 7.

Figure 8A:
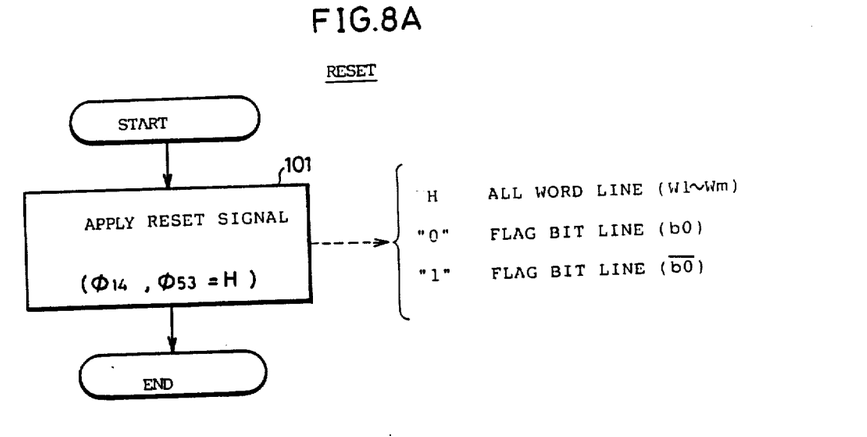
FIGS. 8A to 8F are flow charts showing flow of control of the content addressable memory shown in FIG. 2.

FIGS. 8A to 8F are flow charts showing the control flow for operating the CAM. The control flow for resetting is shown in FIG. 8A. High level reset signals $\phi_{14}$ and $\phi_{53}$ are applied from the controller 5 to the word line control circuit 6 shown in FIG. 7 and to the flag bit control portion 11 shown in FIG. 5 (STEP 101). Consequently, all word lines W1 to Wn are brought to the high level and the signals "0" and "1" are respectively applied to the flag bit lines b0 and $\overline{b0}$. The data "0" is stored in the flag bit column 12 to finish the resetting.

Figure 8B:
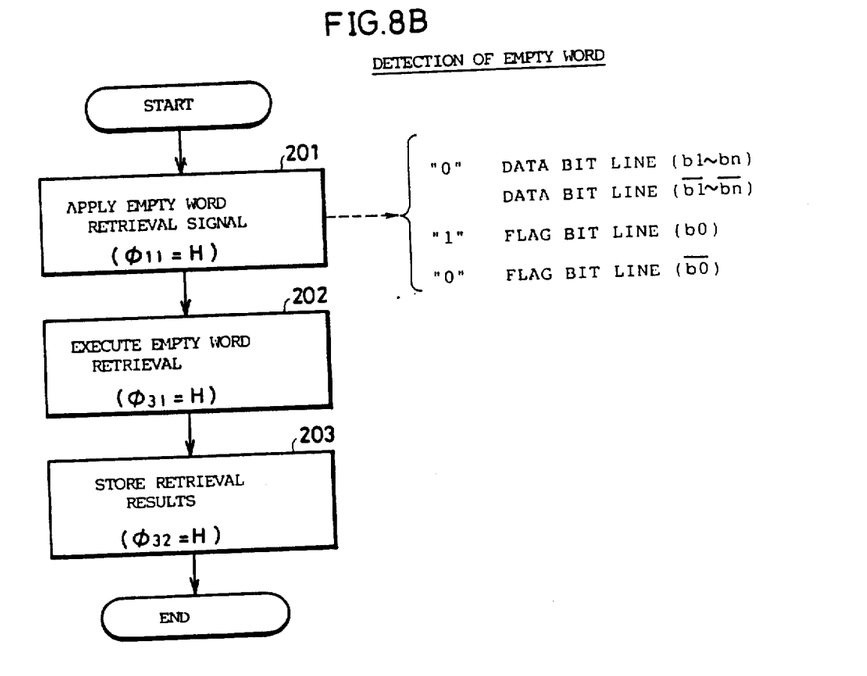

FIG. 8B shows a control flow for empty word retrieval. A high level empty word retrieval signal $\phi_{11}$ is applied from the controller 5 to the flag bit control portion 11 (STEP 201) and the signal "0" is applied to all data bit lines $\overline{b1}$ to $\overline{bn}$ and b1 to bn while the signals "1" and "0" are respectively applied to the flag bit lines b0 and $\overline{b0}$. Applying the signal "0" to all data bit lines means masking these bit lines. By applying a high level retrieval execution signal $\phi_{31}$ to the response register 3 shown in FIG. 6, the empty word retrieval is carried out (STEP 202). By applying a high level retrieval result holding signal $\phi_{32}$, a signal indicating the result of retrieval is stored in the result holding portion in the response register 3 (STEP 203).

Figure 8C:
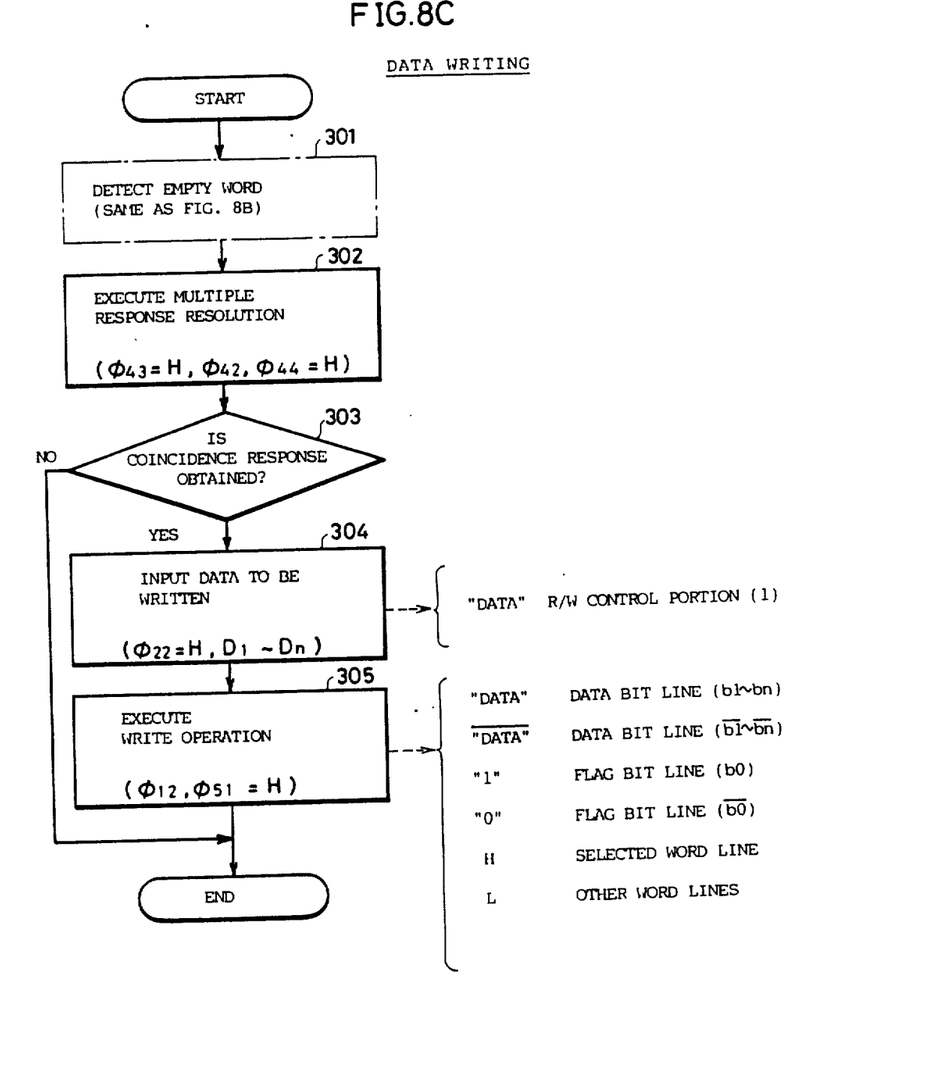

FIG. 8C shows a control flow for writing data. First, in order to detect the empty word, the same operation as the empty word detecting operation shown in FIG. 8B is carried out (STEP 301). In general, a plurality of empty words are detected. Therefore, multiple response resolution is effected to select one from the plurality of empty words (STEP 302). The multiple response resolver 4 shown in FIG. 6 is reset by applying a high level resolver reset signal $\phi_{43}$, and thereafter, a high level multiple response resolving signal $\phi_{42}$ and the resolver activating signal $\phi_{44}$ are applied. Thereafter it is determined whether the coincidence response is obtained or not (that is, whether one empty word is detected or not) (STEP 303). When the coincidence response is obtained, a high level write data holding signal $\phi_{22}$ is applied to the reading/writing control portion 1 shown in FIG. 5 and, simultaneously, the data to be written therein is also applied thereto (STEP 304). Next, a high level write signals $\phi_{12}$ and $\phi_{51}$ are respectively applied to the flag bit control portion 11 and the word line control circuit 6 (STEP 305). On the selected word line, that is, the word line on which the empty word is detected is brought to the high level and other word lines are brought to the low level. A data signal indicating the data to be written and the inverted signal thereof are respectively applied to the data bit lines b1 to bn and $\overline{b1}$ to $\overline{bn}$. Meanwhile, the signals "1" and "0" are respectively applied to the flag bit lines b0 and $\overline{b0}$. When no coincidence response is obtained, the operation will be finished.

Figure 8D:
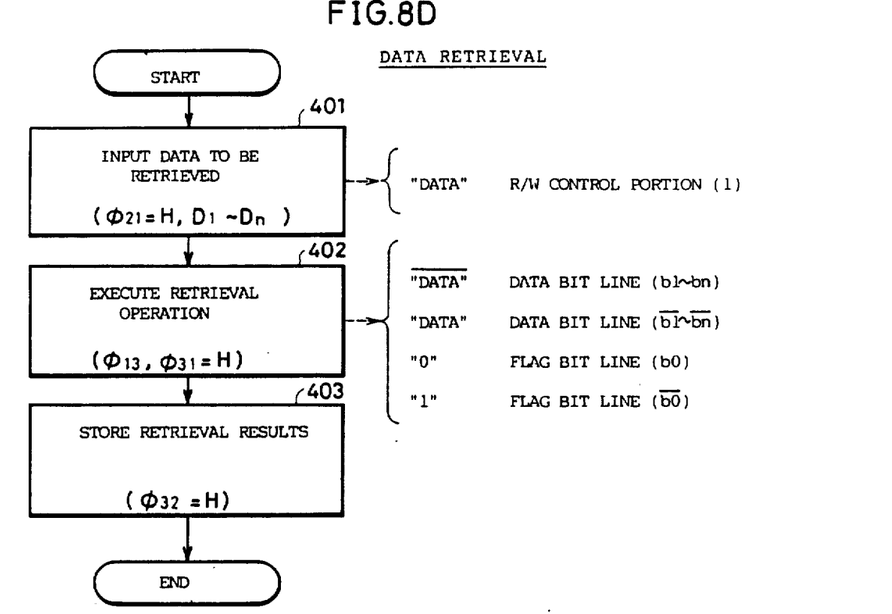

FIG. 8D shows a control flow for making a retrieval with applied data. A high level retrieval data holding signal $\phi_{21}$ is applied to the reading/writing control portion 1 and the data to be retrieved is also applied thereto simultaneously (STEP 401). A high level normal retrieval signal $\phi_{13}$ and the retrieval execution signal $\phi_{31}$ are applied to the flag bit control portion 11 (STEP 402). The data signal indicating the date to be retrieved and the inverted signal thereof are respectively applied to the data bit lines b1 to bn and $\overline{b1}$ to $\overline{bn}$. The signals "0" and "1" are respectively applied to the flag bit lines b0 and $\overline{b0}$. The signal showing the result of retrieval is stored in the circuit 32 in the response register 3 (STEP 403).

Figure 8E:
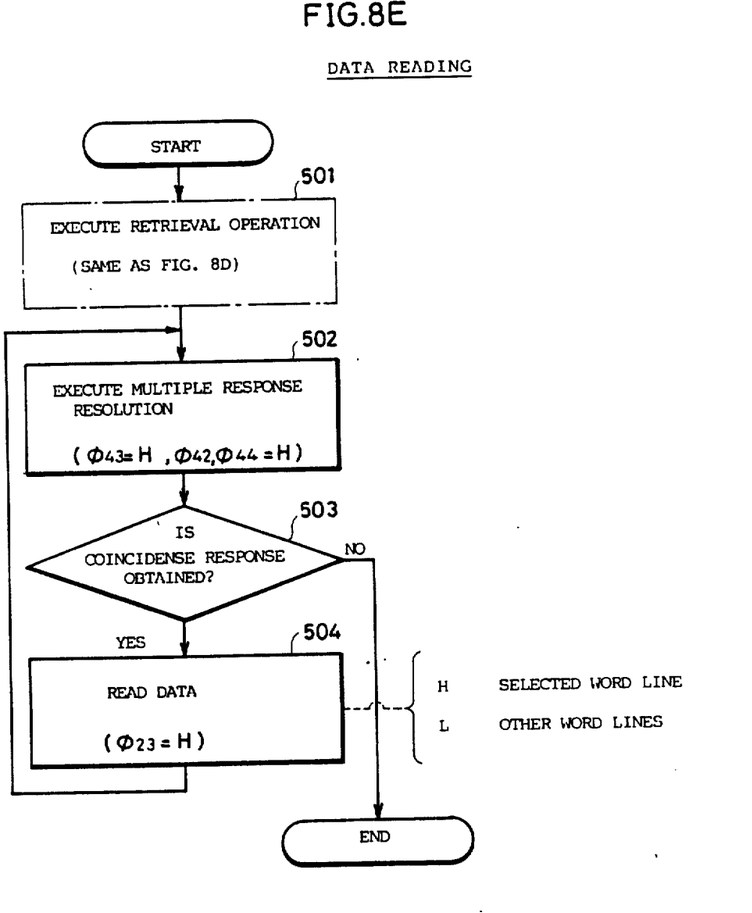

FIG. 8E shows a control flow for reading data based on the applied data. First, in order to detect the word in which the same data as the applied data is stored, the same data retrieval operation as shown in FIG. 8D is carried out (STEP 501). Thereafter multiple response resolution is effected to select one word (STEP 502). After a high level resolver preset signal $\phi_{43}$ is applied to the multiple response resolver 4 for resetting, high level multiple response resolving signal $\phi_{42}$ and the resolver activating signal $\phi_{44}$ are applied. Then, it is determined whether the coincidence response is obtained or not (that is, whether one word is detected or not) (STEP 503). When the coincidence is obtained, the word line of the word selected by the multiple response resolver 4 is brought to the high level. By applying a high level reading signal $\phi_{23}$ to the reading/writing control portion 1, the data is read from the selected word in the data array 2 through the reading/writing control portion 1 (STEP 504). After the data are successively read from the data array for all the words detected by the data retrieval, when the coincidence response is not detected any more, the operation is finished.

Figure 8F:
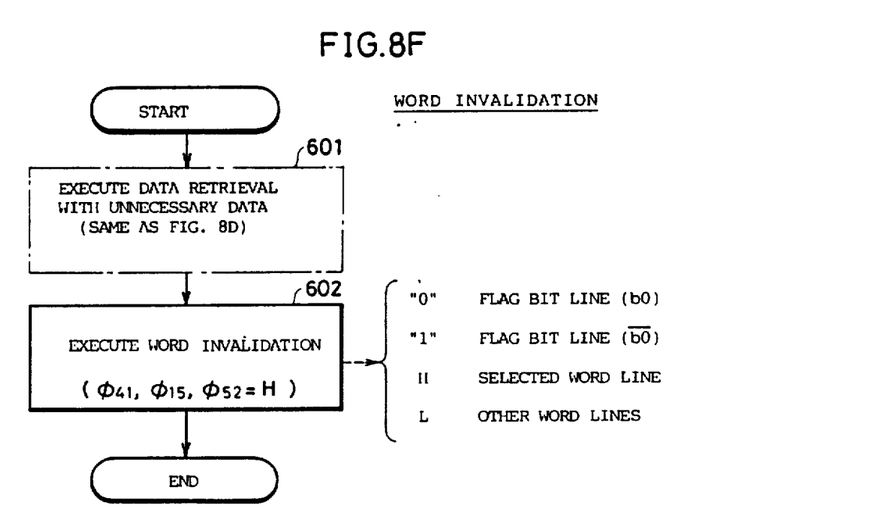

FIG. 8F shows a control flow for invalidating the data of the word which becomes unnecessary. First, in order to detect the word in which unnecessary data is stored, the same data retrieval operation as shown in FIG. 8D is carried out with the unnecessary data (STEP 601). Thereafter, word invalidation is carried out for detected words (STEP 602). On this occasion, a high level resolver inactivating signal $\phi_{41}$ is applied to the multiple response resolver 4, whereby the multiple response resolution is not effected. Therefore, a plurality of words are detected and the word invalidation is simultaneously carried out for all of them. Namely, a high level word invalidating signal $\phi_{52}$ is applied to the word line control circuit 61 and the word lines of the detected words are selectively brought to the high level. Meanwhile, other word lines remain at a low level. A high level word invalidating signal $\phi_{15}$ is applied to the flag bit control portion 11, and the signals "0" and "1" are respectively outputted to the flag bit lines b0 and $\overline{b0}$.

As described above, the present invention comprises a predetermined flag storing means in a CAM cell array, and means for applying a flag signal indicating whether each word in the CAM cell array is in the data written state or an empty state to the flag storing means. In the retrieval operation, when a retrieval is made in the CAM cell array with the retrieval data, a retrieval is made in the flag storing means simultaneously with the flag signal indicating the data written state. Therefore, a specified word can be correctly detected from the words correctly written by the data writing operation. In addition, there is no need to provide an additional complicated circuit for controlling the flag storing means.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A content addressable memory (CAM) device for performing a retrieving operation based upon given retrieval data and for designating a specified word or word group, comprising:

a CAM cell array (2) for storing data therein, a predetermined column (2) within said array (2) forming a flag storing means;

first input/output control means (1) for entering write data to said CAM cell array (2) and for outputting read data from said CAM memory cell array (2), with a particular timing;

second input/output control means (11) for entering a flag signal to said predetermined column (12) of said CAM cell array (2), with timing thereof controlled in common with said particular timing of said first input/output control means (1);

said flag storing means (12) receiving from the second input/output control means (11) and storing a flag signal indicating whether each word in the CAM cell array (2) is in a data written state or in an empty state and for undergoing retrieval by said first and second input/output control means (1), (11);

reset means (11) for writing a flag signal indicating an empty state for all words of said flag storing means (12);

empty word retrieving means (1, 3, 11) for detecting an empty word by making a retrieval in said flag storing means (12) by the flag signal from said second input/output controls means (11);

data writing means (1, 11) for writing in an empty word of said CAM cell array (2) the data from said first input/output control means (1) and for simultaneously writing in the corresponding portion of said flag storing means (12) the flag signal indicating the data written state from said second input/output control means (11);

specified word retrieving means (1, 3, 11) for detecting a specified word by making a retrieval in said CAM cell array (2) with retrieval data from said first input/output control means (1) and simultaneously making a retrieval in said flag storing means with the flag signal from said second input-/output control means (11).

2. A content addressable memory according to claim 1, further comprising reading means (1) for reading data in a specified word selected by said specified word retrieving means (1, 3, 11) from said CAM cell array (2).

3. A content addressable memory according to claim 1, further comprising word invalidating means (11) for writing, when the data of a specified word or a specified word group selected by said specified word retrieving means (1, 3, 11) should be invalidated in said CAM cell array (2), the flag signal indicating an empty state in a corresponding portion in said flag holding means (12).

4. A content addressable memory according to claim 1, further comprising word selecting means (4) for selecting, when a plurality of words are detected by said empty word retrieving means (1, 3, 11) or said specified word retrieving means (1, 3, 11), one from the plurality of words based on a predetermined logic.

5. A content addressable memory according to claim 1, wherein the flag signal applied from said second input/output control means (11) to said empty word retrieving means (1, 3, 11) comprises a flag signal indicating an empty state.

6. A content addressable memory according to claim 1, wherein the flag signal applied from said second input/output control means (11) to said specified word retrieving means (1, 3, 11) comprises a flag signal indicating a data written state.

7. A method for operating a content addressable memory (CAM) device for performing a retrieving operation based upon given retrieval data and for designating a specified word or word group, wherein said CAM device comprises:
  a CAM cell array (2) for storing data therein, a predetermined column (12) within said CAM cell array (2) forming a flag storing means;
  first input/output control means (1) for entering write data to said CAM cell array (2) and for outputting read data from said CAM cell array (2) with a particular timing; and
  second input/output control means (11) for entering a flag signal to said predetermined column (12) of said CAM cell array (2) with timing thereof controlled in common with said particular timing of said first input/output control means (1);
  said flag storing means receiving from said second input/output control means (11) and storing a flag signal indicating whether each word in said CAM cell array (2) is in a data written state or in an empty state and for undergoing retrieval by said first and second input/output control means (1), (11);
  said method for operating said CAM device, comprising the steps of:
  writing a flag signal indicating an empty state for all words in said flag storing means (12) for resetting;
  detecting an empty word by making a retrieval in said flag storing means (12) with the flag signal from said second input/output control means (11);
  writing in an empty word of said CAM cell array (2) the write data from said first input/output control means (1) and simultaneously writing in a corresponding portion of said flag storing means (12) the flag signal indicating a data written state; and
  detecting a specified word by making a retrieval in said CAM cell array (2) with retrieval data from said first input/output control means (1) and simultaneously making a retrieval in said flag storing means (12) with the flag signal from said second input/output control means (11).

8. A method for operating a CAM device according to claim 7, further comprising the step of reading data of a specified word selected from said CAM cell array (2) by a specified word retrieving means (1, 3, 11).

9. A method for operating a CAM device according to claim 7, further comprising the step of writing, when data of a specified word or a specified word group selected by a specified word retrieving means (1, 3, 11) in said CAM cell array (2) is to be invalidated, a flag signal indicating an empty state in a corresponding portion in said flag holding means (12).

10. A method for operating a CAM device according to claim 7, further comprising the step of, when a plurality of words are detected by an empty word retrieving means (1, 3, 11) or by a specified word retrieving means (1, 3, 11), selecting one therefrom based on a predetermined logic.

* * * * *